United States Patent
Beck

(10) Patent No.: US 8,945,316 B2
(45) Date of Patent: Feb. 3, 2015

(54) METHOD FOR SHAPING AND SLICING INGOTS USING AN AQUEOUS PHOSPHATE SOLUTION

(75) Inventor: Mark Jonathan Beck, Los Gatos, CA (US)

(73) Assignee: Fontana Technology, Campbell, CA (US)

( * ) Notice: Subject to any disclaimer, the term of this patent is extended or adjusted under 35 U.S.C. 154(b) by 158 days.

(21) Appl. No.: 13/300,412

(22) Filed: Nov. 18, 2011

(65) Prior Publication Data

US 2012/0060815 A1    Mar. 15, 2012

Related U.S. Application Data

(63) Continuation-in-part of application No. 12/069,205, filed on Feb. 7, 2008, now Pat. No. 8,075,697.

(60) Provisional application No. 61/416,068, filed on Nov. 22, 2010.

(51) Int. Cl.

| | | |
|---|---|---|
| C10M 141/10 | (2006.01) | |
| B28D 5/00 | (2006.01) | |
| B08B 7/00 | (2006.01) | |
| C11D 3/06 | (2006.01) | |
| C11D 7/16 | (2006.01) | |
| C11D 11/00 | (2006.01) | |
| G03F 1/82 | (2012.01) | |
| H01L 21/02 | (2006.01) | |
| H01L 21/67 | (2006.01) | |

(52) U.S. Cl.
CPC ............... *B28D 5/0076* (2013.01); *C11D 3/06* (2013.01); *C11D 7/16* (2013.01); *C11D 11/0047* (2013.01); *C11D 11/007* (2013.01); *G03F 1/82* (2013.01); *H01L 21/02057* (2013.01); *H01L 21/02087* (2013.01); *H01L 21/67051* (2013.01)
USPC ............. 134/42; 208/161; 125/30.01; 125/39

(58) Field of Classification Search
None
See application file for complete search history.

(56) References Cited

U.S. PATENT DOCUMENTS

| | | | |
|---|---|---|---|
| 4,268,404 A | | 5/1981 | Ahlgrim et al. |
| 5,346,556 A | * | 9/1994 | Perry et al. .......................... 134/2 |

(Continued)

FOREIGN PATENT DOCUMENTS

| | | |
|---|---|---|
| WO | 2009/126922 A2 | 10/2009 |
| WO | 2010/009881 A1 | 1/2010 |
| WO | 2011/044718 A1 | 4/2011 |

OTHER PUBLICATIONS

Patent Abstracts of Japan, JP 2010-074056 (Tomohiro et al.), Apr. 2, 2010, abstract and four pages of machine translation of JP 2010-074056.

*Primary Examiner* — Nicole Blan
(74) *Attorney, Agent, or Firm* — Donald J. Pagel

(57) ABSTRACT

A method for slicing a workpiece into wafers in which a polyphosphate solution is applied to the workpiece during the slicing process. The method comprises the steps of positioning the workpiece, such as a silicon ingot, in the vicinity of a wire saw that can cut through the workpiece without the use of an abrasive slurry; causing an aqueous polyphosphate solution to contact the workpiece; and causing the wire saw to cut into the workpiece while the polyphosphate solution is in contact with the workpiece. After the workpiece has been cut into wafers, the polyphosphate solution is rinsed off of the wafers. Preferably, the wire saw used in this method is a diamond wire saw.

12 Claims, 2 Drawing Sheets

(56) References Cited

U.S. PATENT DOCUMENTS

| | | | |
|---|---|---|---|
| 5,507,962 A | * | 4/1996 | Jahanmir et al. ............... 83/13 |
| 5,534,172 A | * | 7/1996 | Perry et al. ................. 508/156 |
| 5,817,711 A | * | 10/1998 | Kambe et al. ............... 524/501 |
| 2002/0014574 A1 | * | 2/2002 | Wakita et al. ................ 249/204 |
| 2005/0245422 A1 | * | 11/2005 | Yamada et al. ............... 510/417 |
| 2007/0023027 A1 | * | 2/2007 | Nakai et al. ..................... 125/21 |
| 2009/0308001 A1 | | 12/2009 | Wu et al. |

* cited by examiner

METHOD FOR SHAPING AND SLICING INGOTS USING AN AQUEOUS PHOSPHATE SOLUTION

This application claims the benefit of U.S. provisional application 61/416,068, filed Nov. 22, 2010, which is incorporated herein by reference.

BACKGROUND OF THE INVENTION

As presently practiced, silicon ingots are used for silicon wafer fabrication. When used for photovoltaic applications, silicon ingots can be both polycrystalline and monocrystalline. In either case, the ingot needs to be further sawn or shaped into the desired shape after either crystal pulling (monocrystalline) or after solidification from the molten state (polycrystalline) into a block. In the case of monocrystalline pulling, the ingot coming out from the crystal pulling operation is usually cylindrical in shape and has a circular cross section. This cylindrical shape needs to be converted into a near or quasi-square shape by an is operation called "squaring." During the squaring operation a wire saw cuts ends of the cylindrically shaped ingot in order to end up with a near square ingot. Traditionally this has been done with steel wires together with a slurry that contains an abrasive, such as silicon carbide (SiC).

Similarly for the polycrystalline case, so called silicon "bricks" have to be cut with a wire saw from the block of silicon that results the solidification process. After the ingot shaping operations, the ingot needs to be sliced into wafers. This is also done with a wire saw. As was described previously, conventional wire saws for all these operations comprise steel wires that are used with a slurry that contains the abrasive. The slurry medium in which the abrasive is dissolved is usually ethylene glycol.

However, currently a new type of wire saw is being introduced into the process. The new wire saw comprises a diamond coated steel wire, where the diamond bits are embedded on the steel wire with a nickel coating. For example, a machine that can be adapted to use the new diamond coated steel wire cutting technology is commercially available from the Swiss company MB Wafertec, under the product designations DS 271 and DS 264.

An advantage of the new wire saws (called "diamond wire" saws or DW saws) is that the slurry does not need to contain the abrasive, because the diamond on the wire functions as the abrasive. When using diamond wire saws, there is a need for a new solution that can keep the abraded silicon that is generated during the sawing operation, in solution so that the abraded silicon does not contaminate the photovoltaic substrates or build up on the machinery used with the diamond wire saw. Additionally, the new solution does not need to contain an abrasive and the new solution should be more environmentally friendly with respect to waste treatment and disposal issues than the ethylene glycol solutions used previously.

BRIEF SUMMARY OF THE INVENTION

Briefly, the present invention comprises a method for slicing a workpiece into wafers in which an aqueous polyphosphate solution is applied to the workpiece during the slicing process. The method comprises the steps of positioning the workpiece, such as a silicon ingot, in the vicinity of a wire saw that can cut through workpiece without the use of an abrasive slurry; causing an aqueous polyphosphate solution to contact the workpiece; and causing the wire saw to cut into the workpiece while the polyphosphate solution is in contact with the workpiece. After the workpiece has been cut into wafers, the polyphosphate solution is rinsed off of the wafers. Preferably, the wire saw used in this method is a diamond wire saw.

The polyphosphate solution used in the present invention is effective at keeping small particles and debris from the cutting operation in suspension, thereby reducing the build-up of abraded particles on both the wafers and the equipment used in the slicing process. Additionally, the polyphosphate solution does not contain an abrasive and is more environmentally friendly with respect to waste treatment and disposal issues than is an ethylene glycol solution.

DETAILED DESCRIPTION OF THE INVENTION

Figure 1:
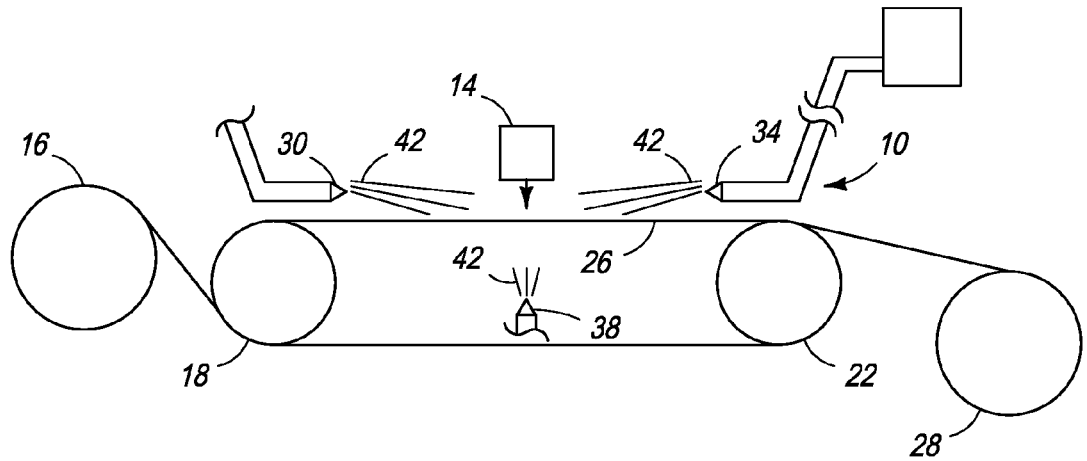
FIG. 1 is a schematic illustration of a prior art slicing apparatus that uses a wire saw.

FIG. 1 illustrates a slicing apparatus 10 for cutting a workpiece 14 used in the prior art. The apparatus 10 comprises a feed spool 16, first reel 18, a second reel 22, a wire 26 and a take-up spool 28. A first dispensing means 30, a second dispensing means 34, and a third dispensing means 38, are positioned to dispense a fluid 42 that contacts at least a region of the wire 26 and at least a region on the workpiece 14. A commercially available machine that can function as the apparatus 10 is available from the Swiss company MB Wafertec under the product designations DS 271 and DS 264. In the present invention, the fluid 42 comprises an aqueous polyphosphate solution as is described below. In the prior art, the fluid 42 typically comprises either a slurry comprised of an abrasive material suspended in a liquid such as ethylene glycol, or simply deionized water without an abrasive material.

Typically, the wire 26 is one long continuous wire that is wrapped around the reels 18 and 22. The feed spool 16 delivers the wire 26 to the reels 18 and 22, while the take-up spool 28 collects the wire 26 after it has passed around the reels 18 and 22. In use, the wire 26 is accelerated from the feed spool 16 to the take-up spool 28. When the feed spool 16 senses that it is near the end of the wire 26, the wire decelerates, reverses direction and then moves in the opposite direction (i.e. from the take-up spool 28 to the feed spool 16). During a slicing procedure, the wire 26 is accelerated, the fluid 42 is sprayed onto the wire 26 and the workpiece 14 is lowered onto the wire 26. The motion of the wire 26 as it moves from the feed spool to the take-up spool and vice versa, slices the workpiece 14 into sections.

Figure 2:
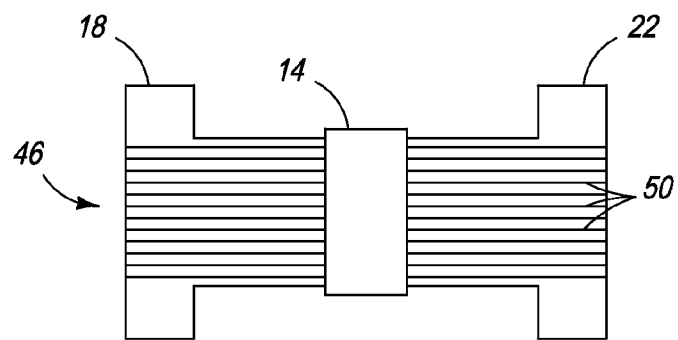
FIG. 2 is a schematic illustration of a prior art wire saw cutting surface.

Generally, using only a single section of the wire 26 to cut the workpiece 14 is not practical because it would only result in one cut in the workpiece 14. While this could be useful in some situations, it is typically more useful to utilize a plurality of cutting surfaces to make a plurality of simultaneous cuts in the workpiece 14. In the apparatus 10, this is accomplished by forming a cutting surface 46. FIG. 2 illustrates that the cutting surface 46 is comprised of a plurality of cutting sections 50 of the wire 26 formed when the wire 26 is wrapped around the first reel 18 and the second reel 22 many times (for example, thousands of times).

The plurality of the cutting sections 50 are each accelerated from the first reel 18 to the second reel 22 (i.e. through the cutting surface 46) when the wire 26 is accelerated from the feed spool 16 to the take-up spool 28. When the feed spool comes near to the end of the wire, the wire decelerates, reverses direction and then moves in the opposite direction (i.e. from the take-up spool to the feed spool). During a slicing procedure, the plurality of the cutting sections 50 are accelerated, the fluid 42 is sprayed onto selected regions of the cutting surface 46 and/or the workpiece 14, and the workpiece 14 is lowered onto the cutting surface 46. The motion of the cutting surface 46 as the plurality of the cutting sections 50 move from the first reel 18 to the second reel 22 and vice versa, slices the workpiece into a plurality of thin sections.

Figure 3:
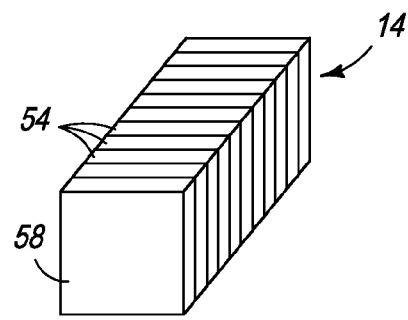
FIG. 3 is a schematic illustration of a prior art workpiece sliced into sections.

FIG. 3 illustrates that after the slicing operation by the apparatus 10, the workpiece 14 is divided into a plurality of thin sections or wafers 54. Generally, n number of cutting sections 50 produces n+1 number of sections 54 after slicing. Each of the individual sections 54 are a cross section of the workpiece 14. Therefore, if the workpiece 14 is shaped so that it has a square cross section, the individual sections 54 will each have at least one square face 58.

In the preferred embodiments, the workpiece 14 comprises a photovoltaic semiconductor material, meaning a semiconductor material that can convert solar radiation into direct current electricity. Preferable photovoltaic semiconductor materials include monocrystalline silicon, polycrystalline silicon and amorphous silicon. A workpiece comprised of polycrystalline silicon is the most preferred material for use in the present invention. Other photovoltaic materials such as cadmium telluride can also be used.

The workpiece 14 can have various shapes, but frequently in the photovoltaic industry, ingots of polycrystalline silicon have a brick shape that is cuboid in nature. For example, the shape of the workpiece 14 could be a rectangular cuboid or a square cuboid. In FIGS. 1 and 2, the workpiece 14 is illustrated as having a square cuboid shape. A workpiece comprised of polycrystalline silicon and having a square cuboid shape is the most preferred configuration for the workpiece 14 in the present invention. However, other shapes can be used for the workpiece 14, including cylindrically shaped workpieces.

In the method of the present invention, a workpiece, such as the workpiece 14 is sliced into one or more sections by positioning the workpiece in the vicinity of a wire saw, such as the wire 26; by causing a polyphosphate solution to contact the workpiece, such as by spraying the polyphosphate solution onto the wire 26 and workpiece 14 (FIG. 1); and by causing the wire saw to cut into the workpiece while the polyphosphate solution is in contact with the workpiece, such as by lowering the workpiece 14 onto the wire saw (FIGS. 1 and 2).

Additionally, after the workpiece has been sliced into two or more of the sections 54, and the slicing has been stopped, the polyphosphate solution is removed from the sections 54, such as by rinsing the sections with water. Preferably, deionized (DI) water is used in this step, but other rinse solutions could be used. The water can be sprayed on the sections 54, or other methods of rinsing can be used, such as dipping the sections in a rinse tank.

In addition to forming the sections or wafers 54 shown in FIG. 3, the method of the present invention can be used in forming the workpiece 14. For example, in the "squaring" operation discussed earlier, a wire saw is used to cut the ends off of a cylindrically shaped is ingot in order to end up with a near square (i.e., a rectangular cuboid or a square cuboid) ingot that can be used as the workpiece 14. The polyphosphate solution of the present invention can be used in "shaping" procedures of this type.

In the preferred embodiments, the wire 26 is a wire that can cut or slice the workpiece 14 without the use of an abrasive material in the fluid 42. Most preferably, the wire 26 comprises a wire, usually comprised of steel, which has diamond pieces attached to its surface. The diamonds can be either natural or synthetic diamonds and are usually held on the steel wire by a nickel coating.

In the present invention, the fluid 42 comprises a polyphosphate solution. The polyphosphate solution comprises an aqueous solution of any of the water-soluble polyphosphates. Preferably, linear polyphosphates having the following formula are used:

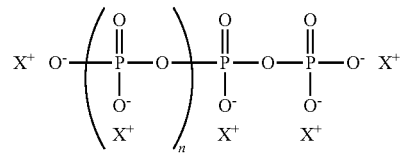

Where n=0, 1, 2, 3, . . . 1000 and $X^+=H^+, Na^+, K^+, NH_4^+, R_3NH^+$. $X^+$ can be a combination of these cations or it can be a single cation chosen from this list repeated on each location of the polyphosphate where $X^+$ is annotated.

Satisfactorily examples of polyphosphates that can be used in the present method include sodium tripolyphosphate (n=1, $X^+=Na^+$), potassium tripolyphosphate (n=1, $X^+=K^+$), ammonium tripolyphosphate (n=1, $X^+=NH_4^+$), triethanolamine tripolyphosphate (n=1, $X^+=$triethanolamine cation), choline tripolyphosphate (n=1, $X^+=$choline cation), Tetra Methyl Ammonium (TMA) tripolyphosphate (n=1,$X^+=TMA^+$), tetrasodium, -potassium and—ammonium pyrophosphate (n=0, $X^+=Na^+$ or $K^+$ or $NH_4^+$), disodium dihydrogen so pyrophosphate (n=0, $X^+=Na^+$ and $H^+$), di-ammonium dihydrogen pyrophosphate (n=0, $X^+=NH_4^+$ and $H^+$) and ammonium polyphosphate (n=1-60, $X^+=NH_4^+$).

When potassium (K) can be used with the workpiece 14, the K-tripolyphosphate is preferred. The K-tripolyphosphate structure is as follows:

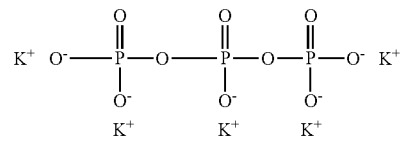 [SMILES: [K+] ; O=P([O-])([O-])OP(=O)([O-])OP(=O)([O-])[O-] ; [K+] ; [K+] ; [K+] ; [K+]]

Although linear polyphosphates are preferred in the present invention, other water soluble polyphosphates can also be used, such as e.g. sodium, potassium or ammonium polymetaphosphate. Sodium hexametaphosphate is a typical example of the polymetaphosphates. The structure of the trimetaphosphoric acid is as follows:

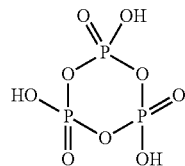

In the present invention, the most preferred polyphosphates are the tripolyphosphates. Typically either Na-tripolyphosphate or K-tripolyphosphate is used or a penta-ammonium tripolyphosphate may be used. Other tripolyphosphates can be used as well, such as, but not limited to, triethanolamine tripolyphoshate or the tripolyphosphoric acid.

The tripolyphosphate in the concentrated source solution is typically between 0.5% and 200%-w and preferably between 2% and 150%-w and most preferably between 5% and 100%-w as a ratio by weight of polyphosphate to added liquid (typically $H_2O$). The maximum concentration is typically determined by the solubility limit of the tripolyphosphate. The solubility of the K-tripolyphosphate is much higher than the solubility of the Na-tripolyphosphate. E.g. the Na-tripolyphosphate solubility is only about 20%-w. The K-tripolyphosphate on the other hand is much more soluble and can be dissolved even up to about 150%-w concentrations. The penta ammonium tripolyphosphate is also very soluble, but is not so widely available. After dilution of the source solution at point-of-use, the final concentration of tripolyphosphate for cleaning the substrates is preferably 0.2%-15%.

The tripolyphosphate and preferably the K- or the penta ammonium tripolyphosphate can be used by itself, it can be used combined and it can also be combined with potassium or ammonium hydroxide. Potassium or ammonium hydroxide is typically added to increase the pH of the solution. Surfactants and chelating agents can also be added. The tripolyphosphate in a concentrated source solution is typically between 0.5% and 200% and preferably between 2% and 150% and most preferably between 5% and 100% relative to the $H_2O$ in the solution. When ammonium hydroxide is added to the concentrated source solution, it can be added in a concentration range of 1%-28%-w (weight of $NH_3$) to make a source solution consisting of ammonium hydroxide and ammonium polyphosphate. Potassium hydroxide can be added to the K-tripolyphosphate in the source solution in a range of 0.001%-45% (weight of KOH).

After dilution in the fab the final concentration of polyphosphate for shaping and slicing the ingots is preferably 0.2%-15% by weight in the solution. Typically the source solution will be diluted between 5 and 50 times with DI water in the fab to make up the ingot slicing/shaping solution, preferably 7 to 25 times, and most preferably 9 to 15 times.

The source solution may also contain from 0.01% to 20% of an organic amine. Suitable organic amine compounds may be selected from alkanolamines (e.g. primary alkanolamines: monoethanolamine, monoisopropanolamine, diethylethanolamine, ethyl diethanolamine, secondary alkanolamines: diethanolamine, diisopropanolamine, 2-(methylamineo)ethano, morpholine, ternary alkanolamines: triethanolamine, tri-isopropylamine), alkylamines (e.g. primary alkylamines, monomethylamine, monoethylamine, monopropylamine, monobutylamine, monopentylamine, cyclohexylamine, secondary alkylamines: dimethylamine), alkyleneamines (e.g. primary alkylene amines: ethylenediamine, propylenediamine, triethylenetetramine), and mixtures thereof. Preferred examples of such materials include monoethanolamine, ethylenediamine, triethylenetetramine and mixtures thereof. The most preferred is monoethanolamine. The amount of the organic amine preferably ranges from 0.01% to 20%, and most preferably from 0.2% to 2%.

The source solution may also contain a biocide such as 2-Methyl-4-isothiazolin-3-one (MIT) or 2-Methyl-4-Isothiazolin-3-one Hydrochloric acid ($C_4H_4NOS$, HCl), (MIHCA). The concentration of the biocide is preferably from 1 ppm to 100 ppm, and most preferably from is 30-70 ppm. Other biocides may be used as well.

Surfactants can also be added. Typically non-ionic surfactants are preferred. Preferred surfactants are the ethylene oxide type surfactants with a general structure $C_nH_{2n+1}O(C_2H_4O)_mH$. Ideally the number of carbon atoms in the hydrocarbon chain n is 1.5 or less times the number of oxyethylene groups m. Ideally the number of carbon atoms n is more than 0.5 of the number of oxyethylene groups m. A good non-ionic surfactant is $C_{12}H_{25}O(C_2H_4O)_{11}H$. The concentration of the surfactant in the concentrated solution will be between 0.1% and 5%. Preferred concentrations are around 0.5% for the concentrated source solution. The concentration after dilution with water and when used for cleaning the surfaces will be preferably between 0.0001 to 0.5% by weight. This is between 1 ppm and 5000 ppm by weight. More preferably, the concentration after dilution will be between 10 ppm and 500 ppm.

Sequestering agents or complexing agents can also be added. Preferred sequestering or complexing or chelating agents are the nitrogen-containing carboxylic acids such as ethylenediaminetetraacetic acid (EDTA) and diethylenetriaminepentaacetic acid (DTPA). Especially preferred from the standpoint of the cleaning effect is ethylenediamined-o-hydroxyphenylacetic acid (EDDHA). The concentration of the sequestering agent in the concentrated solution will be between 0.1% and 5%. Preferred concentrations are around 0.5%. The concentration of the sequestering agent after dilution with water and when used for cleaning the surfaces will be preferably between 10 ppm and 500 ppm.

For the clarity of this invention, in the remainder of this invention, we will mostly talk about tripolyphosphate, even though other suitable water-soluble polyphosphates can be used as explained earlier. The ammonium polyphosphate is preferred when no alkali metals are allowed, but for the clarity of this invention, in the remainder of this invention, we will mostly talk about the tripolyphosphate. If alkali metals are allowed, the K-tripolyphosphate is preferred. The K in the solution can be rinsed off the surface very effectively, since it does not bind with the surface of the silicon ingots or sliced wafers and is extremely soluble in DI water.

In the present invention, after the shaping/slicing step with the wire 26 is finished, it is advantageous to follow up the shaping/slicing sequence with a DI water rinse, such as a rinse with a spray. A spray rinse can be a regular water spray or an aerosol spray. A regular water spray is effective; preferably a flow in excess of 1 L/min per substrate is very effective. The temperature of the rinse water can be any temperature from 0 degrees C. to 100° C., but a room temperature rinse is preferred because of its ease and economical advantage.

The polyphosphate solutions of the present invention provide advantages in the shaping/slicing process at the point-of-use, i.e. during the process in which the workpiece 14 is being sliced by the wire 26. Another advantage of the polyphosphate solutions is that they can be manufactured in concentrated form off-site and then can be diluted on-site around the time they are needed for a point-of-use operation. The initial preparation of concentrated solutions provides economic benefits, such as reduced shipping and transportation costs. For purposes of illustration, representative examples for the composition of concentrated polyphosphate solutions are described below, along with representative dilutions for the point-of-use polyphosphate solutions.

Example 1

Typical source polyphosphate solutions are made up off-site by mixing a polyphosphate with DI-water to a high concentration. A typical composition of a simple concentrated solution according to the invention is shown in Table 1:

TABLE 1

| Component | Constituents to make 1 L concentrated solution |
|---|---|
| K-tripolyphosphate (as solid powder) | 1000 g |
| Water | Balance to make up 1 L |

To this solution other substances can be added such as e.g. KOH, $NH_4OH$ and monoethanolamine. The addition of KOH can be used to increase the pH further. High pH is useful for increasing the repulsion effect between the abraded particles as is described below. Additionally, when using diamond coated wires where the diamonds are embedded with a nickel coating, it is important to bring the pH up to between 10 and 13, where nickel is quite stable. Hence, the pH is typically preferably adjusted to be between 9 and 14 and more preferably between 10 and 13 and most preferably between 11 and 12.

This solution in concentrated form can be transported to the point of use. The concentrated form of the polyphosphate solution is referred to as a source solution and the concentration of the polyphosphate in this source solution is about 50% by weight (i.e. 1000 g polyphosphate per 1000 g water equals 50%). At the point-of-use, this source solution can be diluted with DI water before use as a shaping/slicing solution. For example, the source solution can be diluted in a ratio of 10:1 DI water:source solution of example 1. The 10:1 diluted solution of example 1 yields a pH of about 9.5 without any KOH added.

Example 2

Typical alkali free polyphosphate source solutions are made up off-site by mixing a polyphosphate with DI-water to a high concentration.

A typical make-up of a simple concentrated solution according to the invention is shown in Table 2:

TABLE 2

| Component | Constituents to make 1 L concentrated solution |
|---|---|
| Water soluble ammonium-polyphosphate (as solid powder) | 500 g |
| Ammonium hydroxide solution dissolved in water in a concentration of 28% (by weight) as $NH_3$ | Balance to make up 1 L |

To this solution other substances can be added such as monoethanolamine, surfactants, sequestering agents and biocides. This solution in concentrated form can be transported to the point of use. At the point of use, this solution can be diluted with DI water before use as a shaping/slicing solution. For example, the concentrated source solution can be diluted in a ratio of 10:1 DI water:source solution. Additionally, other substances can be used to increase the pH of the diluted solution, such as TMAH and choline.

In the present invention, after the shaping/slicing step is completed, a thorough rinsing of the newly cut sections of the workpiece 14 is required. A spray rinsing with high flow spray of water is preferred method of rinsing. Typical spray flows of 1 L/min to 4 L/min per nozzle are preferred. Also an aerosol atomized and accelerated spray can be used. The shaping/slicing step is stopped by various methods, such as by lifting the workpiece 14 off of the wire 26 or cutting surface 46. Alternatively, the motion of the wire 26 can be stopped, or both of these steps can be taken together.

Without being bound by theory, it is thought that the polyphosphate solutions of the present invention work in the following manner. When the wire 26 cuts into the workpiece 14, abraded particles are generated. These abraded particles are comprised of whatever material the workpiece 14 is made of. For example, in the preferred embodiment, abraded particles would be particles of polycrystalline silicon. The water-soluble phosphates in the fluid 42 interact with the abraded particles by putting an additional electrostatic charge on the abraded particles and providing for an increased electrostatic repulsive force between the particles and the surface of the sliced workpiece 14.

Figure 4:
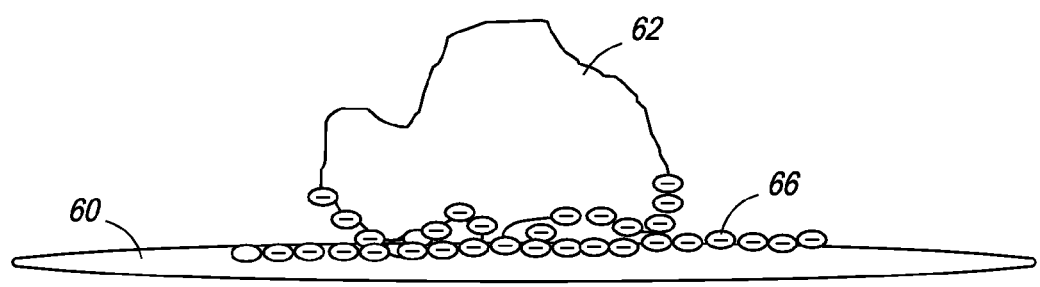
FIG. 4 is a schematic illustration of the particle repulsion effect exhibited by the water-soluble phosphates of the present invention.

This mechanism is illustrated in FIG. 4. In FIG. 4, a medium 60 has an adhered particle 62 on its surface. The medium 60 could correspond, for example, to one of the sections 54 illustrated in FIG. 3, to the workpiece 14 or to the equipment that is used in the apparatus 10. The water-soluble phosphates put a plurality of negative charges 66 on both the surface of the medium 60 and the surface of the particle 62. The repulsion between these negative charges means that the particle 62 and the surface of the medium 60 are repelled and hence the particle can be suspended. Only the charges which are relevant for the repulsion of the particle 62 are shown. The solution of this invention with water-soluble phosphates is very effective for shaping and slicing silicon ingots with a diamond coated wire.

There are several other advantages to using polyphosphate solutions as the fluid 42. First, the main function of the fluid 42 is for cooling and lubrication during the process in which the wire 26 slices the workpiece 14. Water is good for both of these purposes, so an aqueous based fluid 42 is desirable. Second, when using diamond wire as the wire 26, there is no requirement for the fluid 42 to keep any abrasive in suspension. The diamonds on the wire do the action of cutting, so no abrasive is used in the fluid 42. However, pure water will not prevent the abraded silicon from depositing on either the cut wafers or on many of the parts of the apparatus 10. This is because water evaporates easily and leaves all the abraded silicon hard baked on many of the parts of the apparatus 10. Also, water does not prevent the abraded silicon from depositing on the cut wafers.

The polyphosphate solution is superior to pure water because it prevents the abraded silicon from depositing on the cut wafers by keeping the abraded silicon in solution as was described previously. Additionally, polyphosphates are hygroscopic and prevent the water from easily evaporating when the cut solution ends up on the parts of the apparatus 10.

Third, even when the water finally evaporates, the polyphosphate will deposit together with the abraded silicon in a solid deposit on the various parts of the apparatus 10. This solid deposit is now a mix of polyphosphates and abraded silicon as opposed to solely abraded silicon. This mix of polyphosphate and abraded silicon will easily be dissolved in water when spraying or cleaning the equipment later with pure water.

Finally, the use of an aqueous polyphosphate solution in the wafer slicing process has environmental advantages over processes that use ethylene glycol in the fluid 42. Ethylene glycol is a solvent and is difficult to dispose of. Most countries regulate the quantity that can be disposed of in the waste water stream. The polyphosphate solution can simply be neutralized and can be disposed of in the waste stream. Additionally, ethylene glycol is used pure (that is, undiluted), whereas the polyphosphate would typically be used in at least a 10:1 or more dilution. Hence, the volumes of chemicals that need to be transported to the cutting facility are at least 10 times smaller for polyphosphates than for ethylene glycol.

Although the present invention has been described in terms of the presently preferred embodiments, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true scope of the invention.

What is claimed is:

1. A method for slicing a workpiece comprising:
   a. positioning a workpiece in the vicinity of a diamond wire saw;
   b. causing a polyphosphate solution consisting of a polyphosphate, a base and water to contact the workpiece;
   c. causing the diamond wire saw to cut the workpiece into two or more sections while the polyphosphate solution is in contact with at least some of the workpiece and at least some of the two or more sections; and
   d. rinsing the polyphosphate solution off of at least some of the two of more sections with a rinsing solution.

2. The method of claim 1 wherein rinsing solution comprises water.

3. The method of claim 1 wherein the polyphosphate has a concentration of between 0.2% and 15% by weight in the polyphosphate solution.

4. The method of claim 1 wherein the workpiece comprises a semiconductor material.

5. The method of claim 4 wherein the semiconductor material is a photovoltaic material.

6. The method of claim 5 wherein the photovoltaic material comprises silicon.

7. The method of claim 5 wherein the photovoltaic material comprises an ingot of polysilicon having a rectangular cuboid or a square cuboid shape.

8. The method of claim 1 wherein the polyphosphate has the formula:

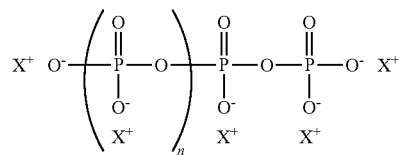

wherein n=0,1,2,3,. . . 1000 and X+ is chosen from the group of H+, Na+, K+, NH$_4$+, R$_3$NH+.

9. The method of claim 8 wherein the polyphosphate is chosen from the group consisting of sodium tripolyphosphate, potassium tripolyphosphate, ammonium tripolyphosphate, triethanolamine tripolyphosphate, choline tripolyphosphate, TMA tripolyphosphate, tetrasodium pyrophosphate, tetrapotassium pyrophosphate and tetraammonium pyrophosphate, disodium dihydrogen pyrophosphate, and diammonium dihydrogen pyrophosphate.

10. The method of claim 1 wherein the base is chosen from the group consisting of KOH, NH$_4$OH, TMAH and choline.

11. The method of claim 1 wherein the polyphosphate solution has a pH in the range of 9-14.

12. The method of claim 1 wherein the polyphosphate solution is rinsed off of the workpiece with a flow higher than 1 L/min.

* * * * *